United States Patent [19]
Abraham et al.

[11] Patent Number: 6,072,718
[45] Date of Patent: Jun. 6, 2000

[54] MAGNETIC MEMORY DEVICES HAVING MULTIPLE MAGNETIC TUNNEL JUNCTIONS THEREIN

[75] Inventors: David William Abraham, Ossining; William Joseph Gallagher, Ardsley, both of N.Y.; Philip Louis Trouilloud, Mahwah, N.J.

[73] Assignee: International Business Machines Corporation, Armonk, N.Y.

[21] Appl. No.: 09/021,342

[22] Filed: Feb. 10, 1998

[51] Int. Cl.$^7$ .................................................. G11C 11/15
[52] U.S. Cl. ............................ 365/173; 365/158; 365/171
[58] Field of Search ................................... 365/158, 171, 365/173; 257/295, 427; 360/113, 119

[56] References Cited

U.S. PATENT DOCUMENTS

| | | | |
|---|---|---|---|
| 5,341,118 | 8/1994 | Parkin et al. | 338/32 R |
| 5,408,377 | 4/1995 | Gurney et al. | 360/113 |
| 5,640,343 | 6/1997 | Gallagher et al. | 365/171 |
| 5,650,958 | 7/1997 | Gallagher et al. | 365/173 |
| 5,659,499 | 8/1997 | Chen et al. | 365/173 |
| 5,768,181 | 6/1998 | Zhu et al. | 365/171 |
| 5,920,500 | 7/1999 | Tehrani et al. | 365/173 |

OTHER PUBLICATIONS

Fernandex, P.J., et al., "Magnetic Force Microscopy of Single–Domain Cobalt Dots Patterned Using Interference Lithography," IEEE Transactions on Magnetics, vol. 32, No. 5, (Sep. 1996), pp. 4472–4474.

Zheng, Y. & Zhu, J., "Micromagnetic Pinciples in Pseudo Spin Valve Memory Element Design," IEEE Transactions on Magnetics, vol. 33, No. 5, (Sep. 1997), pp. 3286–3288.

*Primary Examiner*—Son T. Dinh
*Attorney, Agent, or Firm*—Heslin & Rothenberg, P.C.

[57] ABSTRACT

Magnetic memory devices are disclosed having multiple magnetic tunnel junctions therein writable together into an average state. For example, a magnetic random access memory ("MRAM") array is disclosed having respective pluralities of crossing first and second electrically conductive lines forming a plurality of intersecting regions across the array. The array includes a plurality of magnetic memory cells, each disposed at a respective one of the plurality of intersecting regions. Each cell includes at least two magnetic tunnel junctions therein, writable together into an average state, according to electrical and resultant magnetic stimuli applied thereto via a respective first and second conductive line. The at least two magnetic tunnel junctions provided in each magnetic memory cell provide a predictable magnetic response for all cells across the array. Only the cell at an intersecting region selected by stimuli applied via each of the first and second electrically conductive lines forming the selected region is written, and other cells along the first and second electrically conductive lines forming the selected region are not written. An operating window of applied electrical and therefore magnetic stimuli can be defined to ensure cell selectivity across the memory array.

34 Claims, 12 Drawing Sheets

MAGNETIC MEMORY DEVICES HAVING MULTIPLE MAGNETIC TUNNEL JUNCTIONS THEREIN

CROSS REFERENCE TO RELATED APPLICATIONS

This Application relates to the following commonly assigned, issued U.S. Patents:

1. U.S. Pat. No. 5,640,343, issued Jun. 17, 1997 and entitled "MAGNETIC MEMORY ARRAY USING MAGNETIC TUNNEL JUNCTION DEVICES IN THE MEMORY CELLS"; and
2. U.S. Pat. No. 5,650,958, issued Jul. 22, 1997 and entitled "MAGNETIC TUNNEL JUNCTIONS WITH CONTROLLED MAGNETIC RESPONSE."

This Application relates to the following commonly assigned, concurrently filed U.S. Patent Applications:

1. Application No.: 09/021,515, filed Feb. 10, 1998, and entitled, "INTENTIONAL ASYMMETRY IMPOSED DURING FABRICATION AND/OR ACCESS OF MAGNETIC TUNNEL JUNCTION DEVICES";
2. Application No.: 09/021,352, filed Feb. 10, 1998, and entitled, "LIMITING MAGNETORESISTIVE ELECTRICAL INTERACTION TO A PREFERRED PORTION OF A CHANGEABLE MAGNETIC REGION IN MAGNETIC DEVICES"; and
3. Application No.: 09/021,569, filed Feb. 10, 1998, and entitled, "LIMITING MAGNETIC WRITING FIELDS TO A PREFERRED PORTION OF A CHANGEABLE MAGNETIC REGION IN MAGNETIC DEVICES."

Each of these U.S. Patents and U.S. Patent Applications is hereby incorporated by reference herein in its entirety.

STATEMENT OF GOVERNMENT RIGHTS

The Government of the United States of America has rights in this invention pursuant to Contract No. MDA972-96-C-0030 awarded by the Defense Advanced Research Projects Agency.

TECHNICAL FIELD

This application relates to magnetic devices, e.g., magnetic random access memory ("MRAM") devices, formed from magnetic tunnel junction ("MTJ") devices writable with magnetic stimuli.

BACKGROUND OF THE INVENTION

As discussed in detail in the above-incorporated U.S. Patents, the electrical resistance of a properly formed magnetic tunnel junction memory cell depends on a magnetic writing stimulus applied to the junction. The cell response is hysteretic and the cell therefore retains some memory of the applied magnetic writing stimulus. The remanent magnetic configuration of the tunnel junction device, and its resultant electrical resistance value, is the basis for the application of such devices to electrically accessed MRAM arrays.

To fabricate a large and reliably accessed MRAM array containing thousands or millions of cells on a single chip, uniformity and predictability of the magnetic response characteristic of each cell is of great importance. However, due to many factors related to manufacturing uncertainties and intrinsic magnetic variability, cell to cell response variations can be very large. This magnetic response variability from cell to cell directly impacts the electrical and resultant magnetic writing stimulus needed to access each cell, and therefore prevents array-wide selectivity to occur using a preferred, fixed electrical and resultant magnetic writing stimulus value.

As an example, and with reference to FIGS. 1a–b, in an MRAM array, cells are positioned at the intersections of an exemplary rectangular grid of electrically conductive lines 1–6. The lines are arranged over a substrate and cross, thereby forming intersecting regions at which the cells are positioned, e.g., cell 9. As discussed further below, each cell normally comprises a free magnetic region 24 and a reference magnetic region 22. (The term reference region is used broadly herein to denote any type of region which, in cooperation with the free or changeable region, results in a detectable state of the device as a whole.) The ability of this type of cell to store electrically accessible data hinges on electron tunneling between these two regions, which in turn is dependent on the relative directions of magnetization of these two regions. Rotating the magnetization in the free region into one of two (possible more) selectable directions in a bi-stable manner results in binary state stored in the cell. If the cell is oriented with its magnetic easy-axis ("EA") horizontal then an electrical writing current flowing through a vertical line will apply an EA magnetic field, and a current flowing through a horizontal line will apply a hard-axis ("HA") magnetic field, to the cell.

In one implementation of MRAM cells, the writing of individual cells adheres to a concept referred to as the "asteroid" for switching. The switching threshold of a single free region depends on the combination of EA and HA magnetic fields applied thereto. This "Stoner-Wohlfarth" asteroid model, shown in FIG. 2a, illustrates these threshold values in the plane of applied EA and HA fields. Switching occurs when a combination of EA and HA fields at the cell results in a vector outside of the asteroid. Vectors inside the asteroid will not switch the cell from one of its current bi-stable states. This asteroid model also illustrates how the EA field needed to switch a device is reduced in the presence of an HA bias field. Selectively switching a single cell within the array is achieved by applying electrical currents through a selected pair of horizontal and vertical lines. These currents generate a combination of EA and HA fields only at the cell located at the intersection of these lines, theoretically switching the selected cell, but not the neighboring cells.

All the cells along the horizontal line will experience the same applied HA field. Similarly all the cells along the vertical line will experience the same applied EA field. However, only the cell at the intersection of these lines will experience the combination of both fields necessary for switching.

Problems arise when the thresholds of the asteroid vary from cell to cell, and from hysteresis loop to hysteresis loop in the same cell. This leads to a broadening of the asteroid into a band of threshold values as shown in FIG. 2b. Since the ability to selectively switch cells hinges on all cells except one along a line not being switched under a single applied HA or EA field, if this band of the asteroid broadens too much, then it is no longer possible to selectively write individual cells, with equivalent writing stimuli, since other non-selected cells along the lines will also switch.

FIG. 3 illustrates the variability in the magnetic response for 12 neighboring MRAM devices, actually measured by the instant inventors, taking 2 EA writing loops for each device, for different HA bias fields (Hh). Each plot shows the measured resistance change, in percent, versus the applied EA field, for each given HA bias field (He). (These plots also illustrate how the hysteretic response of the cells depends on the applied HA bias field. To provide the above-mentioned cell selectivity using intersecting lines, it is desirable to operate with some applied HA bias field on one line, and an applied EA field on the other, i.e., $H_{Y1}$ and $H_{X2}$ in FIG. 2. However, it is also desirable to retain some hysteresis, so that the cell remains in one of two bi-stable states when the applied EA and HA fields are removed.) This variability can be summarized on an "asteroid" plot in which the HA bias field is plotted versus the EA coercive field for these loops (FIG. 4). For this set of devices, there is so much scatter that there is no effective applied stimulus operating window for these cells, i.e., there is no set of applied EA and HA fields that would switch each cell if applied thereto together, and that would switch none of the cells if either is applied separately.

Whether using the above-discussed asteroid selection model, or any other selection model, a major challenge in the successful implementation of an MRAM array with effective cell selectivity is the fabrication of many memory cells with nearly identical electrical and magnetic properties. This is particularly difficult for magnetic devices since their response is sensitive not only to local defects but also to edge or surface roughness.

SUMMARY OF THE INVENTION

To overcome the above-discussed deficiencies of known magnetic tunnel junction cells, the instant invention relates to combining a plurality of magnetically exchange decoupled tunnel junctions into a single, composite magnetic device, thereby yielding distinct advantages in quality and uniformity of the response of the device to the applied writing stimulus, in contrast to the respective response of any one of its constituent tunnel junction devices.

In that regard, in one aspect, the present invention relates to a magnetic device, e.g., memory cell, operable using at least one electrode, and comprising at least two magnetic tunnel junctions, writable together into an average state, according to magnetic stimuli applied thereto via the first and second electrodes.

This device may be used as a magnetic memory cell in a memory array, which includes respective pluralities of crossing first and second conductive lines forming a plurality of intersecting regions across the array. A plurality of magnetic memory cells, each disposed at a respective one of the plurality of intersecting regions is provided, and each cell has at least two magnetic tunnel junctions therein. The predictable, average response provided by the at least two magnetic tunnel junctions in each cell results in the characteristic that only the cell at an intersecting region selected by a magnetic stimuli applied via the first and second conductive lines forming the selected intersecting region is written, and other cells along the first and second conductive lines forming the selected intersecting region are not written.

The at least two magnetic tunnel junctions may be arranged between first and second electrodes in series, or, alternatively, in parallel to accept the magnetic stimuli.

Each of the at least two magnetic tunnel junctions may include a first region having a reference direction of magnetization, and a second, free region having a direction of magnetization changeable according to the magnetic stimuli.

The first, reference region of each of the at least two magnetic tunnel junctions may be part of a single, cohesive magnetic region having the reference direction of magnetization.

The second, free region of each of the at least two magnetic tunnel junctions may comprise a magnetic granule, possibly disposed in a region patterned out of a magnetic media type material, having multiple magnetic granules therein, each magnetic granule therefore forming a respective second region.

The second, free region of each of the at least two magnetic tunnel junctions may comprise anti-parallel directions of magnetization therein together changeable according to the electrical and resultant magnetic stimuli applied thereto, one of the anti-parallel directions of magnetization effecting cell tunneling in connection with its respective first region, the anti-parallel directions of magnetization providing the further characteristic of minimizing the mutual magnetic coupling with other magnetic tunnel junctions in the magnetic memory cell.

The multiple magnetic tunnel junctions per device disclosed herein provide the advantage for a magnetic memory that memory cell selectivity can be provided on an array-wide basis using a defined operating window of magnetic stimuli applied via the bit lines and word lines. Further, since each cell is formed from multiple tunnel junctions, when the average response of the tunnel junctions in each cell is used, operation of the array is not significantly impacted by a small number of defective tunnel junctions.

BRIEF DESCRIPTION OF THE DRAWINGS

The subject matter which is regarded as the invention is particularly pointed out and distinctly claimed in the concluding portion of the specification. The invention, however, both as to organization and method of practice, together with further objects and advantages thereof, may best be understood by reference to the following detailed description of the preferred embodiment(s) and the accompanying drawings in which:

FIG. 1b depicts exemplary layers forming a single one of the magnetic memory cells of FIG. 1a;

DETAILED DESCRIPTION OF THE PREFERRED EMBODIMENT(S)

Figure 4:
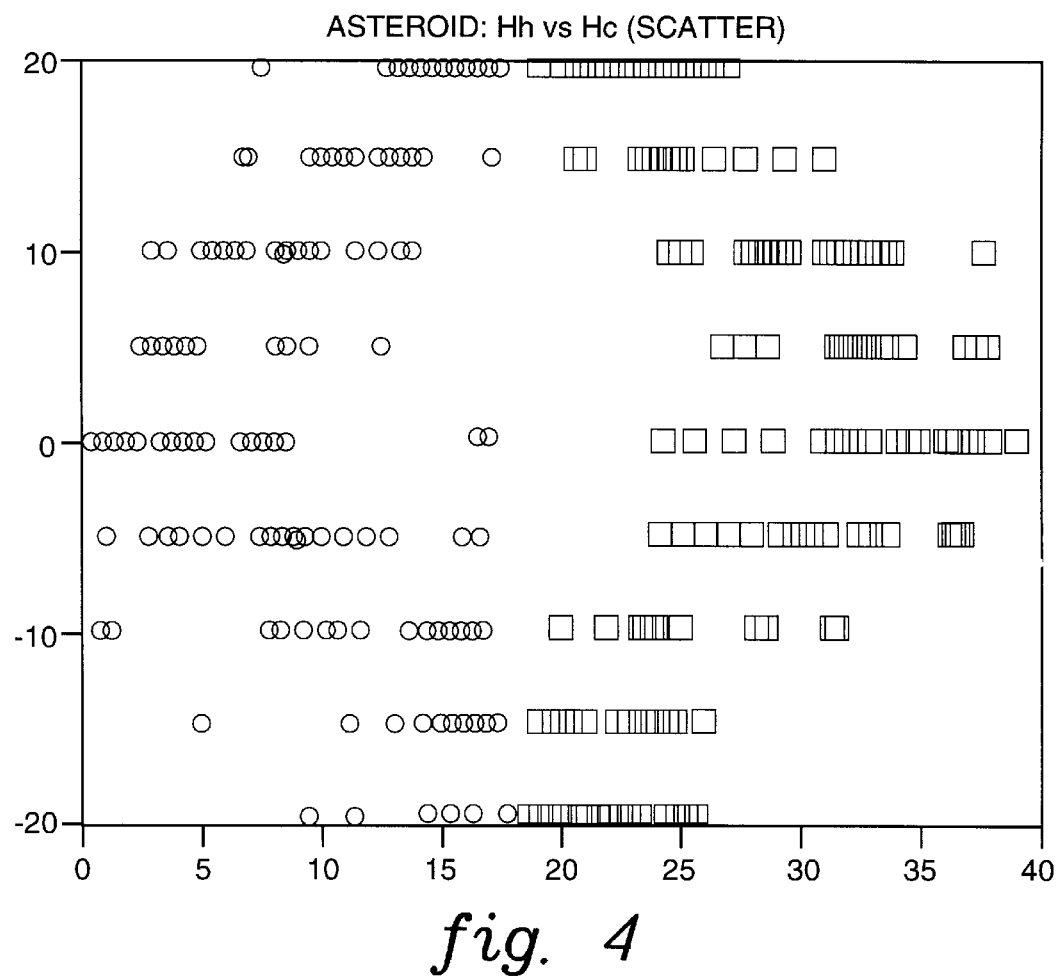
FIG. 4 is an "asteroid" plot summarizing the data depicted in FIG. 3.
Figure 5:
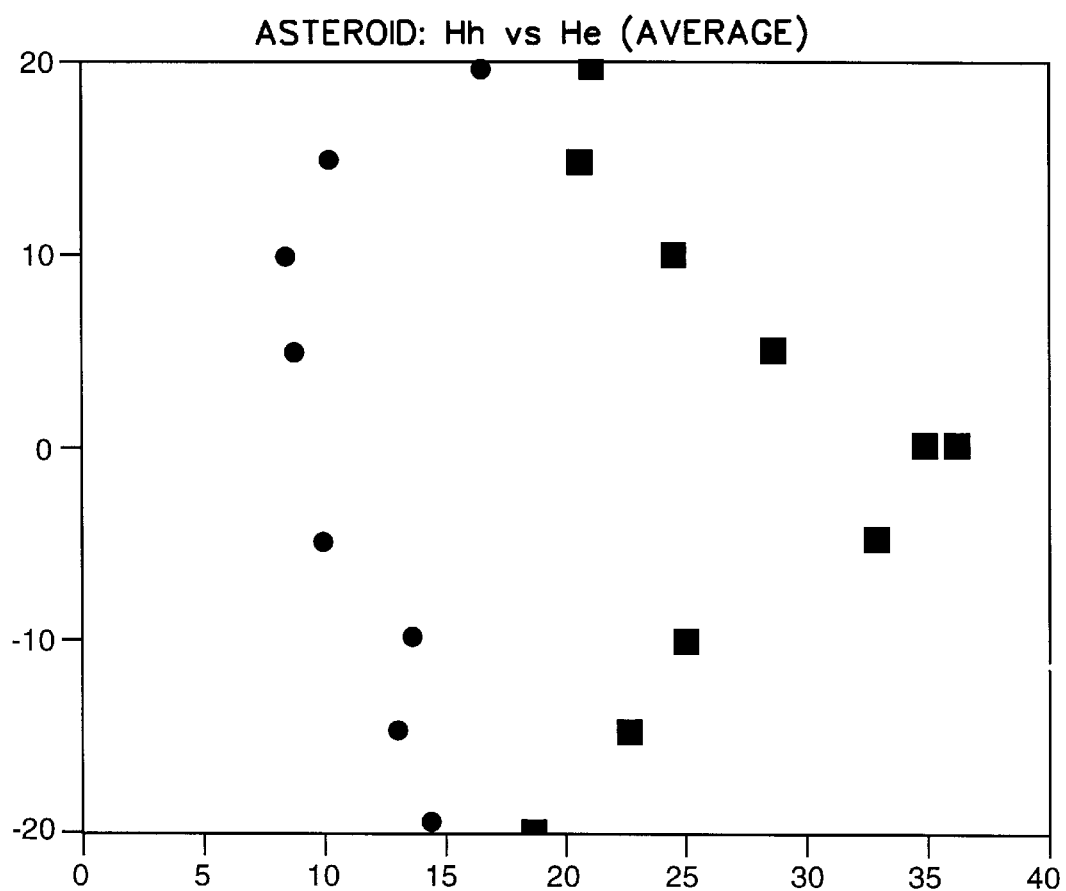
FIG. 5 is an "asteroid" of the averaged data of FIG. 4.
Figure 6:
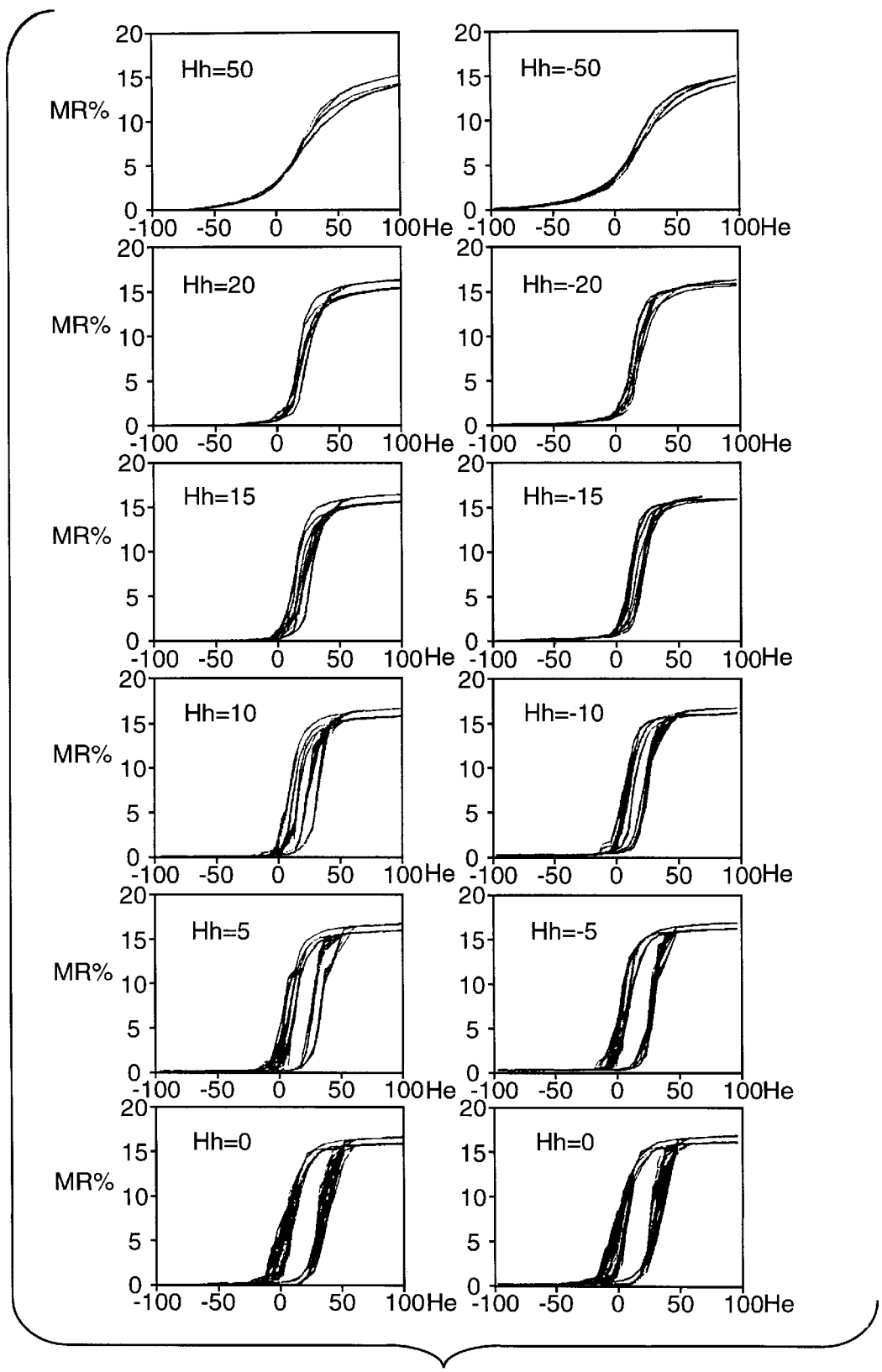
FIG. 6 comprises plots of test data collected for four (4) magnetic memory cells employing the principles of the present invention, i.e., multiple magnetic tunnel junctions in each memory cell.
Figure 7:
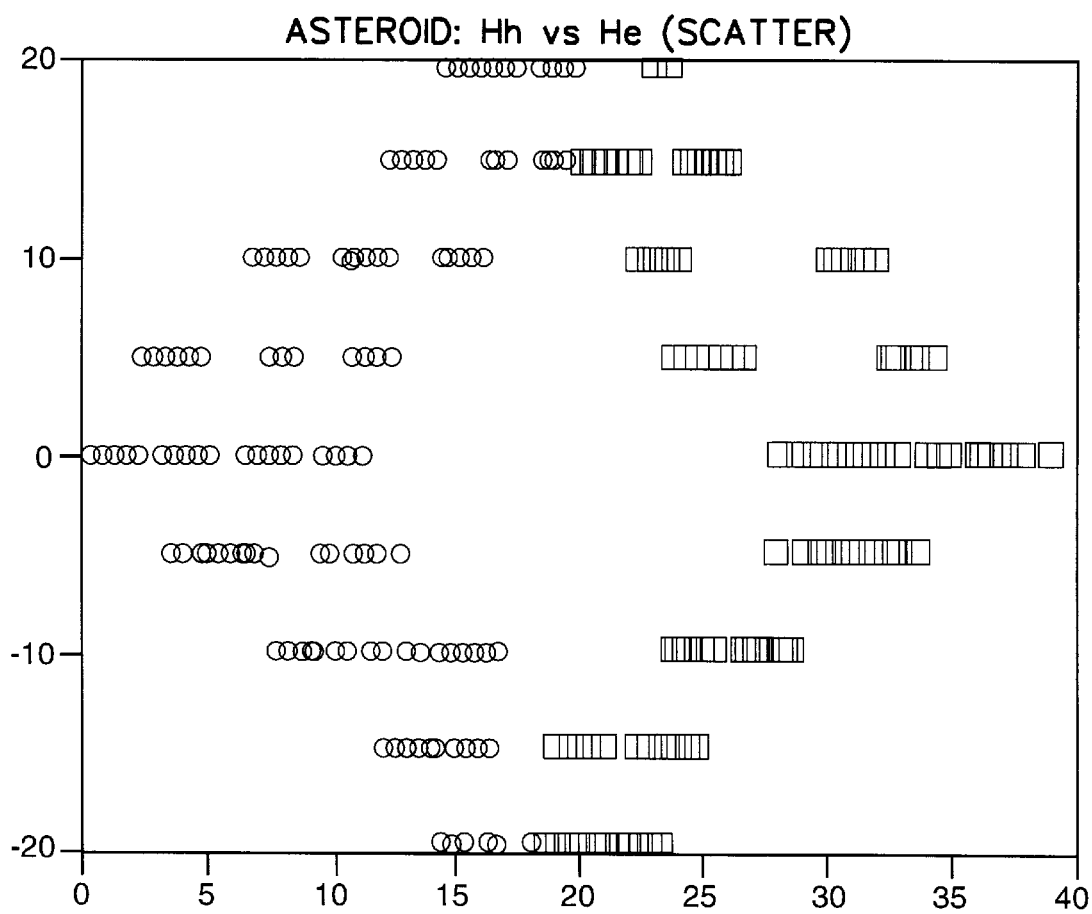
FIG. 7 is an "asteroid" plot summarizing the data depicted in FIG. 6.
Figure 8:
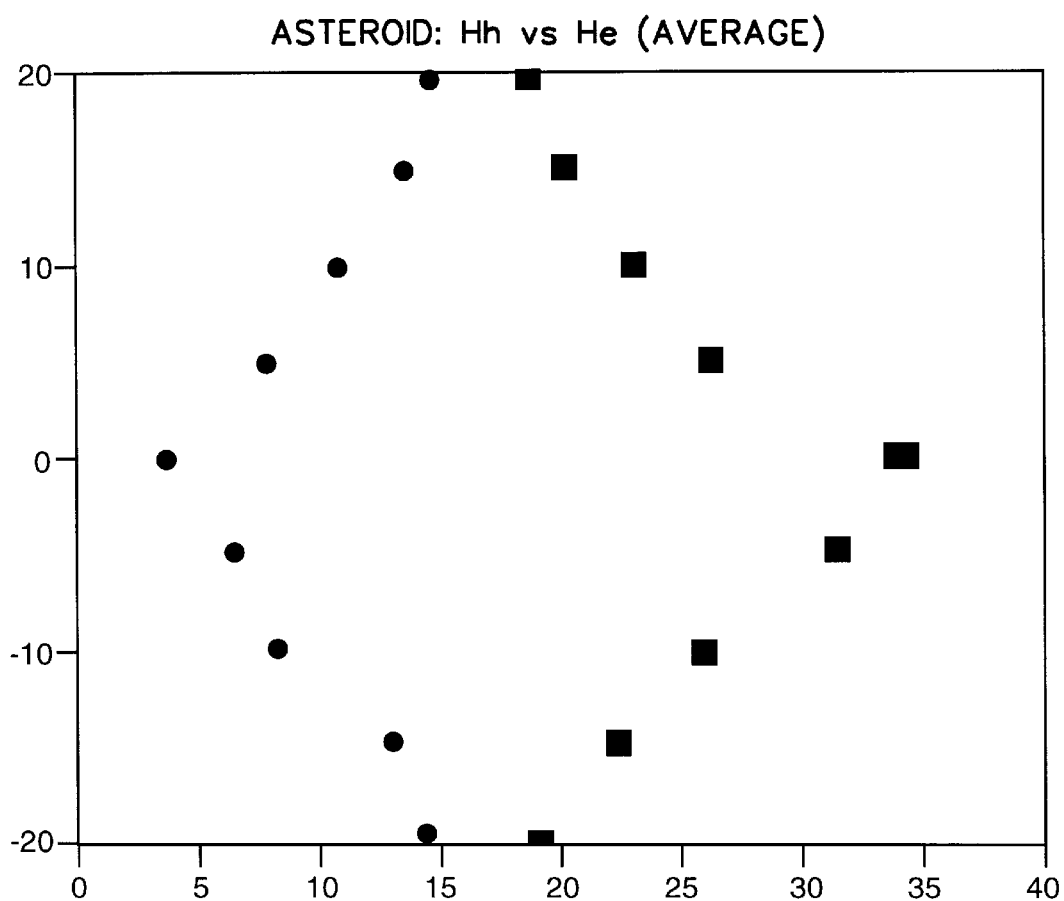
FIG. 8 is an "asteroid" of the averaged data of FIG. 7.

The present inventors have discovered that by averaging the magnetic response data over multiple tunnel junctions, a better and more predictable magnetic response can be obtained. For example, averaging the scattered data of FIG. 4 results in the somewhat more predictable asteroid shape of FIG. 5. The present inventors then implemented, and measured the response of, eight (8) magnetic tunnel junctions arranged in parallel as one memory cell, and measured the response of four (4) such multiple-junction cells with similar junctions, but located far from each other, in the same array. The results of these measurements are shown in FIG. 6. The observed scatter is due to increasing to 20 the number of loops taken. The 20-loop asteroid data of these multiple-junction cells (FIG. 7) is much improved over the asteroids of each of the individual junctions, and the average asteroid over all loops, all devices (FIG. 8) is closer yet to the ideal asteroid shape. Despite the variability of junction properties across the wafer, the asteroid for the combination of these four junctions still provides a window of operation so that selective switching is possible.

Figure 1A:
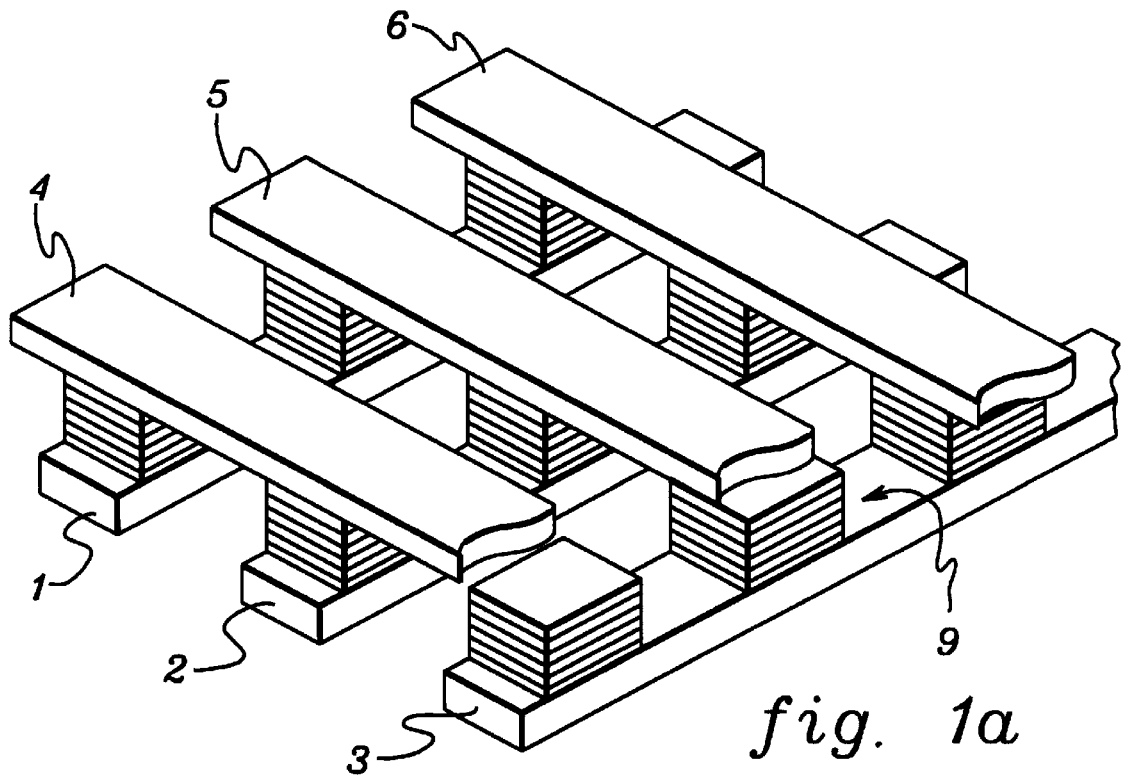
FIG. 1A depicts an MRAM array having magnetic memory cells disposed at the intersecting regions of crossing bit lines and word lines.
Figure 1B:
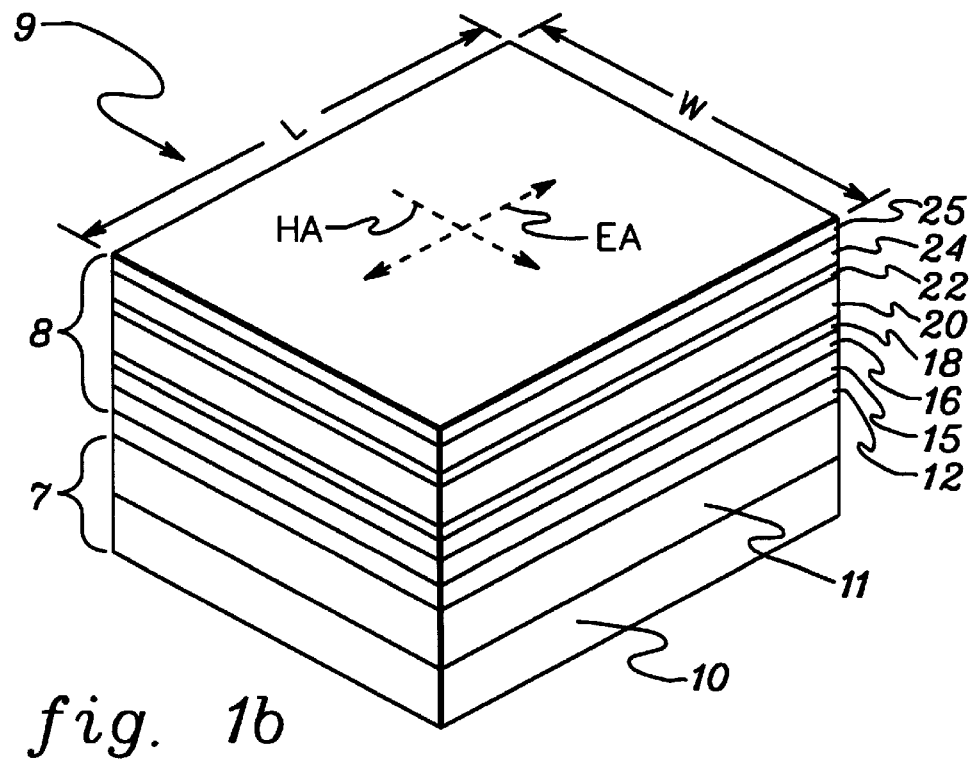
Figure 2A:
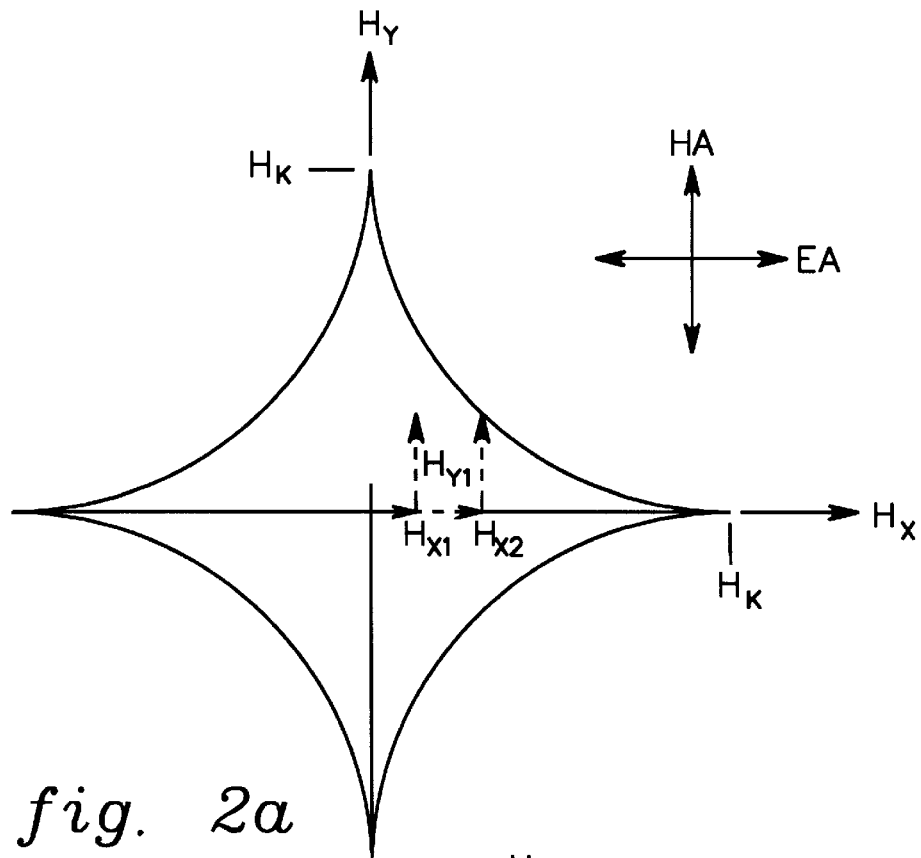
FIG. 2a is an "asteroid" model of the magnetic response of a single, ideal magnetic tunnel junction.
Figure 2B:
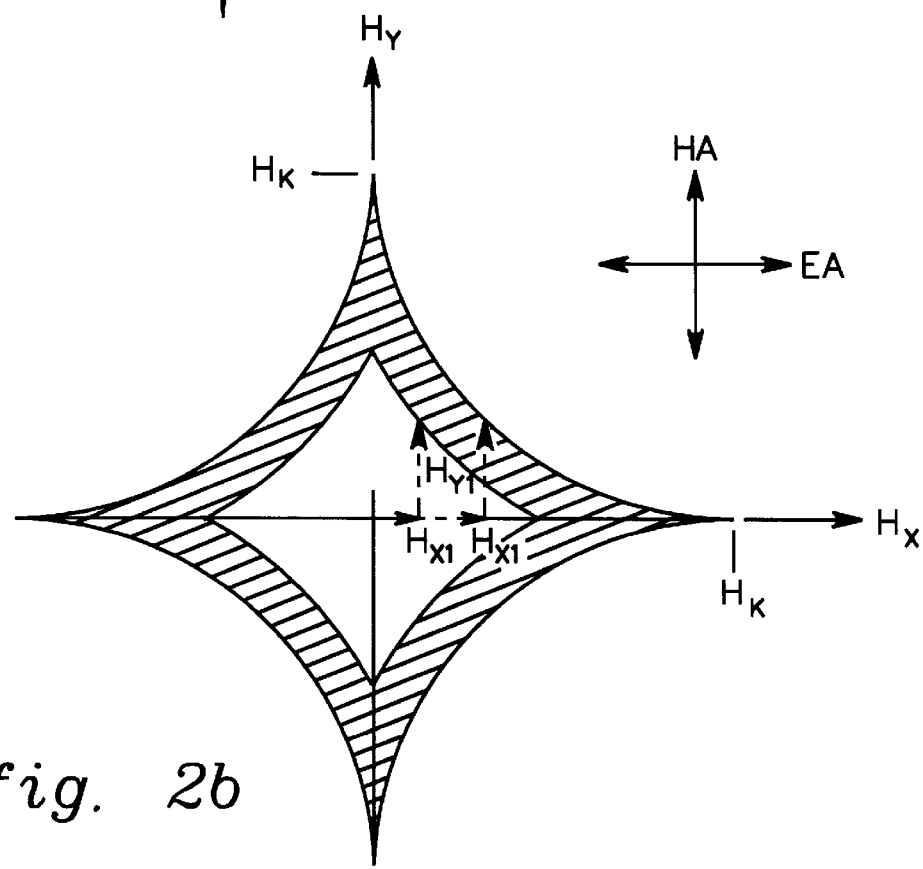
FIG. 2b is an "asteroid" model of the magnetic response of single magnetic tunnel junction cells, each cell having an unpredictable response and therefore narrowing the operating window of electrical and magnetic stimuli values possible to effectively operate an array of such cells.
Figure 3:
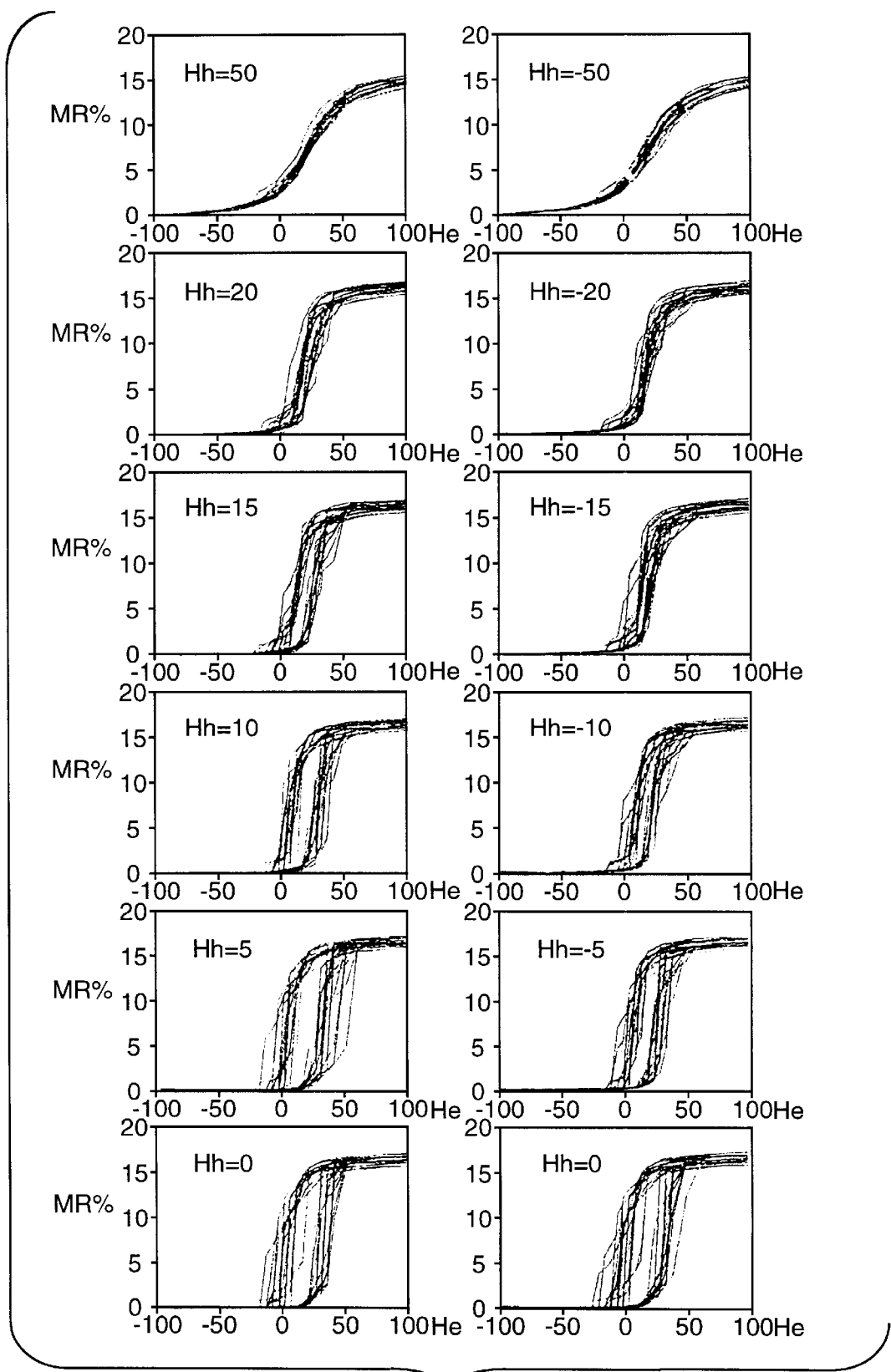
FIG. 3 comprises plots of test data collected illustrating the varying responses of single magnetic tunnel junction cells.

In this regard, and in accordance with the principles of the present invention, a plurality of magnetic tunnel junctions is employed in a single magnetic device, e.g., a memory cell of an MRAM array. The single magnetic tunnel junction ("MTJ") cell 9 of FIGS. 1a–b is therefore improved by providing multiple tunnel junctions therein. Alternate embodiments of the multiple MTJ cell of the present invention are discussed below with reference to FIGS. 9 to 14, however, by way of further introduction, the array of FIGS. 1a–b is now discussed in greater detail, and in accordance with the above-incorporated, commonly assigned U.S. Patents.

With reference to FIG. 1a, an exemplary MRAM array includes a set of electrically conductive lines that function as parallel word lines 1, 2, and 3 in a horizontal plane, and a set of electrically conductive lines that function as parallel bit lines 4, 5, and 6 in another horizontal plane. The bit lines are oriented in a different direction, e.g., at right angles to the word lines, so that the two sets of lines intersect when viewed from above. A memory cell, such as typical memory cell 9 shown in detail in FIG. 1b, is located at each crossing point of the word lines and bit lines in the intersection region vertically spaced between the lines. Three word lines and three bit lines are illustrated in FIG. 1a, but the number of lines would typically be much larger. The memory cell 9 is arranged in a vertical stack and may include a diode 7 and a magnetic tunnel junction ("MTJ") 8. During operation of the array, current flows in a vertical direction through the cell 9. The vertical current path through the memory cell permits the memory cell to occupy a very small surface area. Contact to the word lines, the MTJ, the diode, and the contact to the bit line all occupy the same area. While not shown in FIG. 1a, the array may be formed on a substrate, such as a silicon substrate on which there would be other circuitry. Also, a layer of insulating material is usually located between the bit lines and word lines at regions of the MRAM other than the intersecting regions.

The structure of the memory cell 9 is described in more detail with reference to FIG. 1b. The memory cell 9 is formed on and in contact with a word line 3 (FIG. 1a). The memory cell 9 comprises a vertical stack of a diode-like device, e.g., silicon junction diode 7, and an MTJ 8 in electrical series connection. The diode 7 is a silicon junction diode that comprises an n-type silicon layer 10 and a p-type silicon layer 11. The diode's p-type silicon layer 11 is connected to the MTJ 8 via a tungsten stud 12. The diode's n-type silicon layer 10 is connected to word line 3.

The MTJ 8 may be formed of a series of layers of material stacked one on top of the other. The MTJ 8 of FIG. 1b comprises a template layer 15, such as Pt, an initial ferromagnetic layer 16, such as permalloy (Ni—Fe), an antiferromagnetic layer (AF) 18, such as Mn—Fe, a fixed or "pinned" type of reference ferromagnetic layer (FMF) 20, such as Co, Fe or permalloy, a thin tunneling barrier layer 22 of alumina ($Al_2O_3$), a soft, changeable "free" ferromagnetic layer (FMS) 24, such as a sandwich of thin Co—Fe with permalloy, and a contact layer 25, such as Pt.

The free layer is fabricated to have a preferred axis for the direction of magnetization called the easy axis ("EA"). There are two possible directions of magnetization of the free layer along this easy axis which define the two states of the memory cell. In contrast, the reference layer may be fabricated to have only one preferred direction of magnetization, called its unidirectional anisotropy direction, and this direction is parallel to the easy axis of the free layer. The desired easy axis for the free layer is set by some combination of intrinsic anisotropy, strain-induced anisotropy and shape anisotropy of the MTJ. The MTJ and free layer depicted may be made in the shape of a rectangle of length L and width W, where L is larger than W (FIG. 1b). The magnetic moment of the free layer prefers to align along the direction of L.

The unidirectional anisotropy direction of the reference layer is set by growing the Fe—Mn AF layer 18 on the initial ferromagnetic layer 16, which is itself grown on the template layer 15, such as Pt or Cu or Ta. The template layer 15 induces a 111 crystallographic texture in the initial ferromagnetic layer 16. These layers are deposited in a magnetic field directed parallel to the desired easy axis of the free layer, creating the desired intrinsic unidirectional anisotropy direction of the reference layer. Alternatively, the AF layer can be deposited on the template layer in a sufficiently large magnetic field parallel to the said easy axis while heating the substrate to a temperature higher than the blocking temperature of the AF material. In this alternative, the initial ferromagnetic layer 16 is not required. It is also possible to take advantage of the magnetostriction of the fixed layer to develop, during processing, a magnetic anisotropy which aligns magnetization along the applied magnetic field direction during deposition.

Because of exchange coupling between the reference and AF layers, the magnetization direction of the reference layer is more difficult to change than that of the free layer. In the range of fields applied by currents through the bit and word lines, the magnetization direction of the reference layer is fixed or pinned, in this embodiment. Shape anisotropy of the reference layer, which follows the shape anisotropy of the MTJ, provides additional stability of the magnetization direction of the fixed layer. The magnetic fields applied to write the memory cell are large enough to reverse the direction of magnetization of the free layer, but not the direction of the reference layer. Thus, the magnetization of the fixed layer does not change direction during operation of the memory cells in the MRAM.

During array operation, when a sufficiently large current is passed through both a write line and a bit line of the MRAM, the self-field of the combined current at the intersection of the write and bit lines will rotate the magnetization of the free layer of the single particular MTJ located at the intersection of the energized write and bit lines. The current levels are designed so that the combined self-field exceeds the switching field of the free layer. This self-field is designed to be much smaller than the field required to rotate the magnetization of the reference layer. The cell array architecture is designed so that the write currents do not pass through the MTJ itself. The memory cell is read by passing a sense current perpendicularly through the diode and MTJ from the reference layer through the tunnel junction barrier to the free layer (or vice versa). Since the resistance of the $Al_2O_3$ tunnel barrier is strongly dependent on the thickness of the $Al_2O_3$ layer, approximately varying exponentially with the thickness of this layer, this means that the electrical current largely flows perpendicularly through the $Al_2O_3$ tunnel barrier. The probability of a charge carrier tunneling across the barrier falls off strongly with increasing $Al_2O_3$ thickness so the only carriers that tunnel across the junction are those which traverse perpendicular to the junction layer. The state of the memory cell is determined by measuring the resistance of the memory cell when a sense current, much smaller than the write currents, is passed perpendicularly through the MTJ. The self-field of this sense or read current is negligible and does not affect the magnetic state of the memory cell. The probability of tunneling of charge carriers across the tunnel barrier depends on the relative alignment of the magnetic moments of the free and the reference layers. The tunneling current is spin polarized, which means that the electrical current passing from one of the ferromagnetic layers, for example, the fixed layer, is predominantly composed of electrons of one spin type (spin up or spin down, depending on the orientation of the magnetization of the ferromagnetic layer). The degree of spin polarization of the current is determined by the electronic band structure of the magnetic material comprising the ferromagnetic layer at the interface of the ferromagnetic layer with the tunnel barrier. The first ferromagnetic layer tunnel barrier thus acts as a spin filter. The probability of tunneling of the charge carriers depends on the availability of electronic states of the same spin polarization as the spin polarization of the electrical current in the second it ferromagnetic layer. Usually, when the magnetic moment of the second ferromagnetic layer is aligned to the magnetic moment of the first ferromagnetic layer, there are more available electronic states than when the magnetic moment of the second ferromagnetic layer is aligned anti-aligned to that of the first ferromagnetic layer. Thus, the tunneling probability of the charge carriers is highest when the magnetic moments of both layers are aligned, and is lowest when the magnetic moments are anti-aligned. When the moments are arranged, neither aligned nor anti-aligned, the tunneling probability takes an intermediate value. Thus, the electrical resistance of the cell depends on both the spin polarization of the electrical current and the electronic states in both of the ferromagnetic layers. As a result, the two possible magnetization directions of the free layer uniquely define two possible bit states (0 or 1) of the memory cell.

Figure 9:
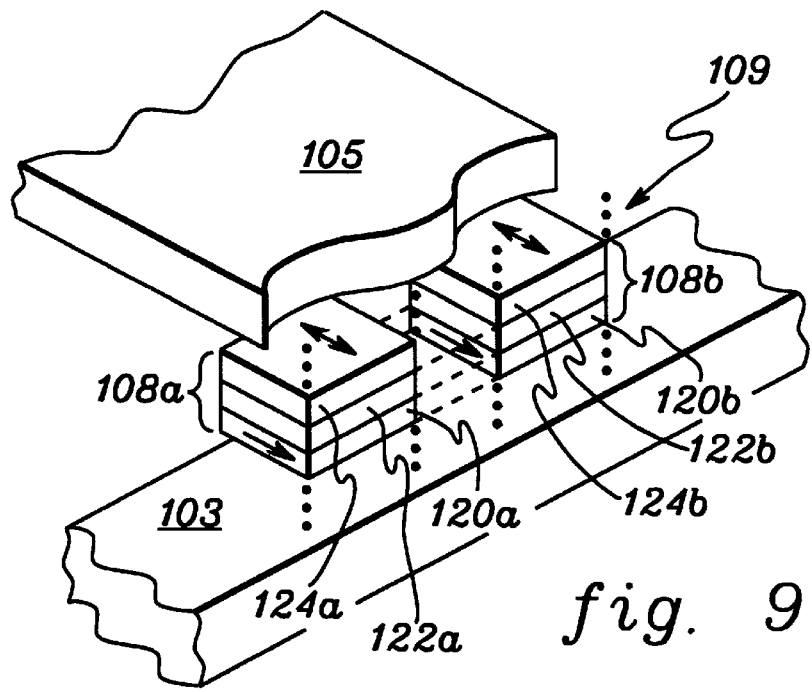
FIG. 9 depicts a first embodiment of the multiple magnetic tunnel junction cell of the present invention, in which the magnetic tunnel junctions are arranged in parallel.

In accordance with the present invention, and with reference to FIG. 9, a magnetic memory cell 109 is provided between conductive lines 103 and 105 (alternatively referred to herein as electrodes, the term electrode broadly defined as capable of imposing an electrical and/or magnetic stimulus). Cell 109 includes at least two magnetic tunnel junctions 108a and 108b. The exemplary embodiment of FIG. 9 shows the magnetic tunnel junctions 108a and 108b arranged in parallel to accept the electrical and resultant magnetic stimuli applied thereto via lines 103 and 105. As discussed in detail above, each magnetic tunnel junction may include a respective reference region 120a, 120b; a respective tunneling region 122a, 122b; and a respective free region 124a, 124b. The writing of the magnetic memory cell is effected by changing the direction of magnetization in the free regions according to the electrical and resultant magnetic stimuli applied via lines 103 and 105, which is symbolically noted by the opposing arrows drawn in the free regions, relative to the single arrow in the reference region.

In accordance with the present invention, it is the average response of all of the tunnel junctions in each cell which is exploited to provide the effective operating window of electrical and resultant magnetic stimuli across the array, which in turn provides effective cell selectivity. Therefore, the multiple junctions in each cell can be considered as holding an average state, but individual junctions may in fact be at different respective states within each cell.

Further, and as shown in dotted line fashion in FIG. 9, reference regions 120a and 120b, and tunneling regions 122a and 122b could actually comprise respective portions of single, cohesive layers, whereas the free regions 124a and 124b are required to be separate, possibly separated by a magnetically insulating material, thereby effecting separate respective tunneling operations for each of the at least two tunnel junctions in each cell. The regions 124a and 124b are required to be magnetically independent, e.g., exchange decoupled. Therefore, multiple tunnel junctions are effected by the presence of multiple free regions, in accordance with the present invention.

The same techniques employed to form the magnetic memory cells in the above-incorporated, commonly assigned U.S. Patents can be used to form the multiple tunnel junction cells of the present invention. The multiple tunnel junctions in each cell can be patterned using e-beam lithography, interference lithography, STM lithography, or stamping into resist, or other known techniques to define small devices.

Figure 10:
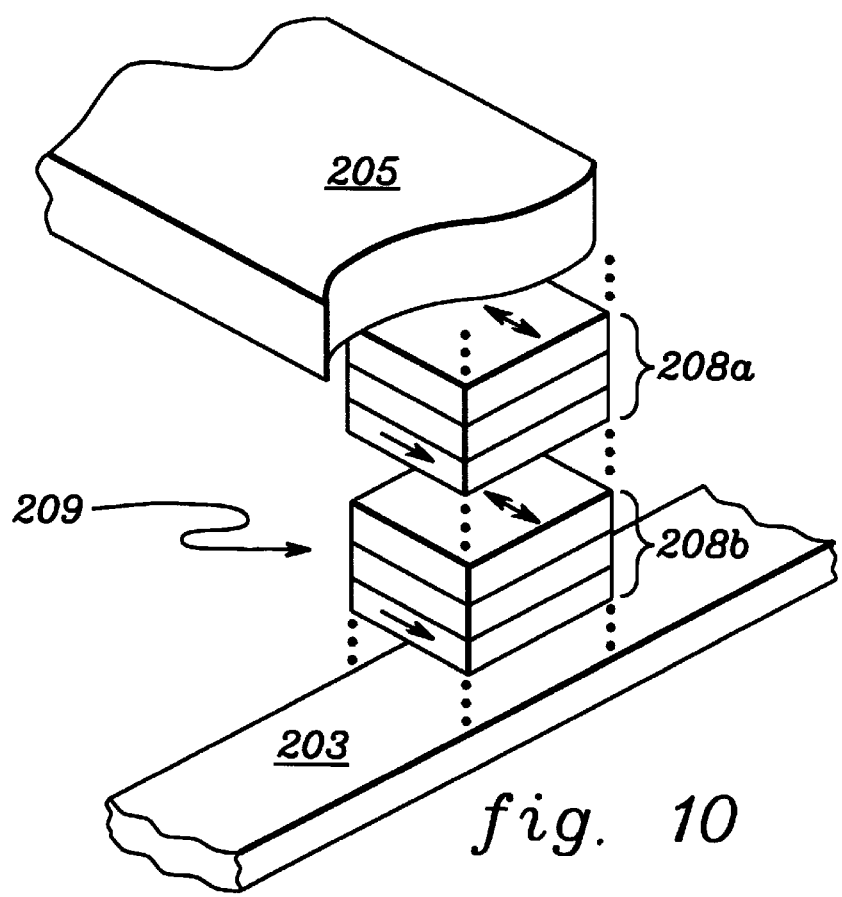
FIG. 10 depicts a second embodiment of the multiple junction cell of the present invention, in which the magnetic tunnel junctions are arranged in series.

With reference to FIG. 10, an alternate embodiment of the present invention is depicted wherein magnetic memory cell 209 includes separate tunnel junctions 208a and 208b arranged in series between lines 203 and 205 to accept the electrical and resultant magnetic stimuli. This magnetic memory cell structure can be formed in accordance with the techniques described in the above-incorporated commonly assigned U.S. Patents, by adding additional layers to define the additional magnetic tunnel junctions within each cell.

Figure 11:
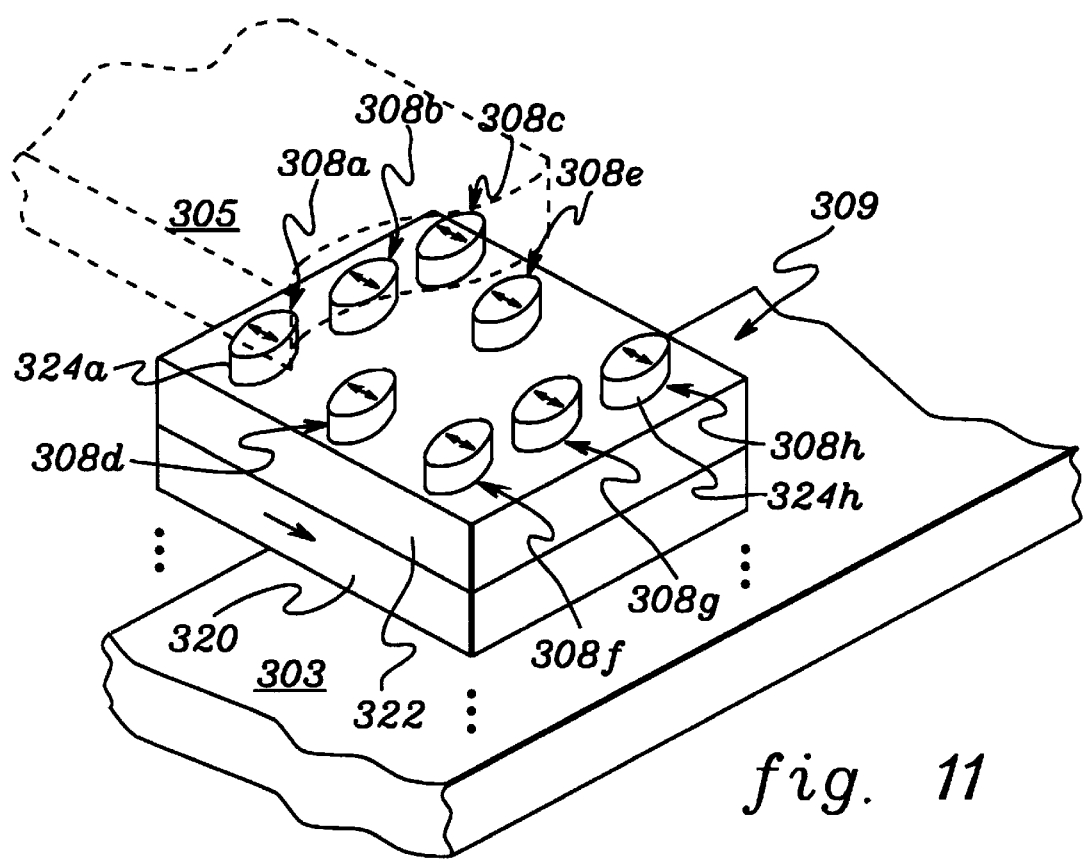
FIG. 11 depicts another embodiment of the present invention in which magnetic granules are used to form the multiple magnetic tunnel junctions in a single cell.

In yet another alternate embodiment of the present invention, and with reference to FIG. 11, a magnetic memory cell 309 is provided having multiple magnetic tunnel junctions 308a–h therein, each having mutually magnetically decoupled free regions 324a–h (not all of which are designated, for clarity), and including a single tunneling layer 322. In this exemplary embodiment, an exemplary underlying reference region 320 is shown comprising a single, cohesive magnetically pinned layer. The multiple, decoupled magnetic "granules" forming the single magnetic memory cell can be formed by, for example, depositing magnetic granules on top of an insulator, and then embedding them in a non-magnetic matrix, co-deposition of insulating and conducting materials, or isolating grains.

In one embodiment, the free layers of the devices are deposited in the form of a succession of at least two thin layers: alternating magnetic material and non-magnetic material (such as silver). Upon annealing, the thin layers of magnetic material segregate into magnetically decoupled grains. It is believed that the silver diffuses into the grain boundaries of the thin magnetic layers and breaks the exchange coupling between them.

In another embodiment, each magnetic granule could be formed as a sphere having an encircling tunnel junction layer, which together are thereafter deposited over the pinned layer.

Figure 12:
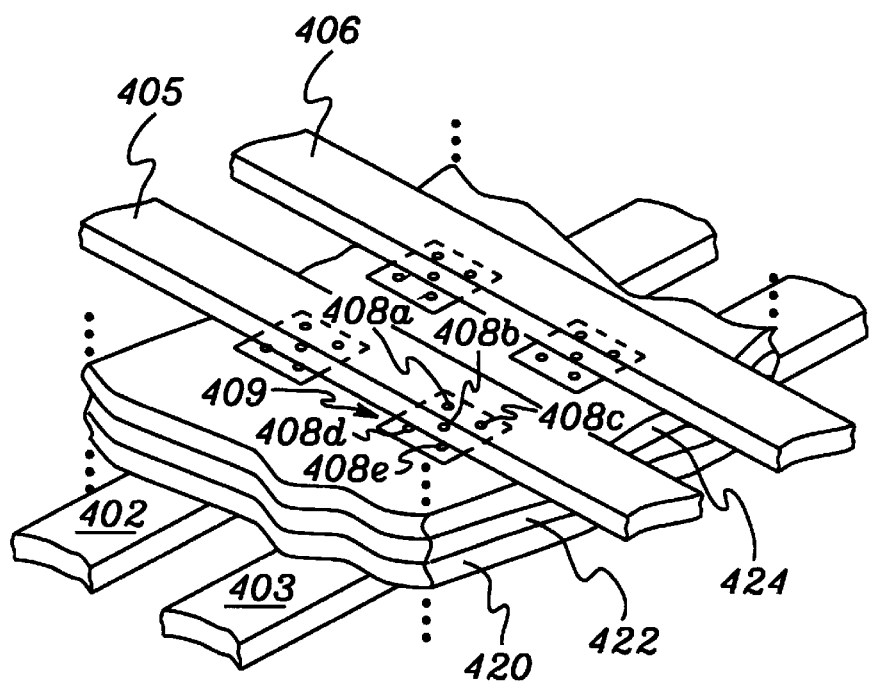
FIG. 12 depicts a magnetic media patterning approach to forming multiple magnetic granule cells.

FIG. 12 illustrates another potential fabrication technique for the granule approach of FIG. 11, wherein cell regions, e.g., cell region 409 having granules 408a–e therein, are patterned from a layer 424 resembling a planar magnetic media. In this regard, magnetic media layer 424 can be deposited, and thereafter patterned, thereby forming the cell regions, e.g., 409, each having multiple magnetic granules therein.

In prior approaches, memory cells based on tunnel junction devices typically used a continuous metallic film. Although these films are often polycrystalline, the magnetization in the grains is strongly exchanged coupled so that, magnetically, each cell acts as a continuous film and a single junction device. The present invention is directed to the use of a granular film similar to that used in magnetic recording as thin film media. These films are made with grains that are magnetically decoupled from an exchange interaction point of view. The grains are not exchanged coupled although they will have some magnetostatic interaction.

In the memory cell of the present invention, each particle or grain is a separate junction. As each particle is different and located differently, each junction will switch at a slightly different coercive filed. When operating the memory cell, it is not necessary to switch all the junctions in the selected cell but just to switch a majority of them so that the written state can be detected during read. Similarly, it is not necessary to not switch all the junctions in a non-selected cell, just to leave the majority of junctions unperturbed so that the storage state is not modified.

For example, consider a cell that is exercised to switch between a "0" and a "1" state and then back again. The writing process is not perfect and the stored state in not completely stable. Under the writing stimulus, at least 90% of the junctions are first switched to the "1" state, and less than 10% switch back because of perturbing fields. The read-back signal from the stored "1" state is then at least 80% of the full signal. Similarly, upon switching the device back to "0", at least 90% of the junctions are switched and less than 10% are later disturbed by other fields. The read-back from the stored "0" is at most 20% of the full signal.

The final result is that the separation between the two stored states may now be as small as 60% of the full signal. In exchange for this reduction, it is no longer necessary to guarantee the switching of every junction under a write stimulus nor the stability of every junction under perturbing fields.

In summary, multiple exchange-decoupled grains in memory cells allow for a tradeoff between signal amplitude and reproducibility in the switching threshold.

As discussed above, the underlying reference region 420 and tunneling region 422 in this type of cell can comprise single, cohesive layers. Further, as discussed above, the overlying and underlying crossing conductive lines 402, 403, 405 and 406 are provided for writing and reading each cell region.

Figure 13:
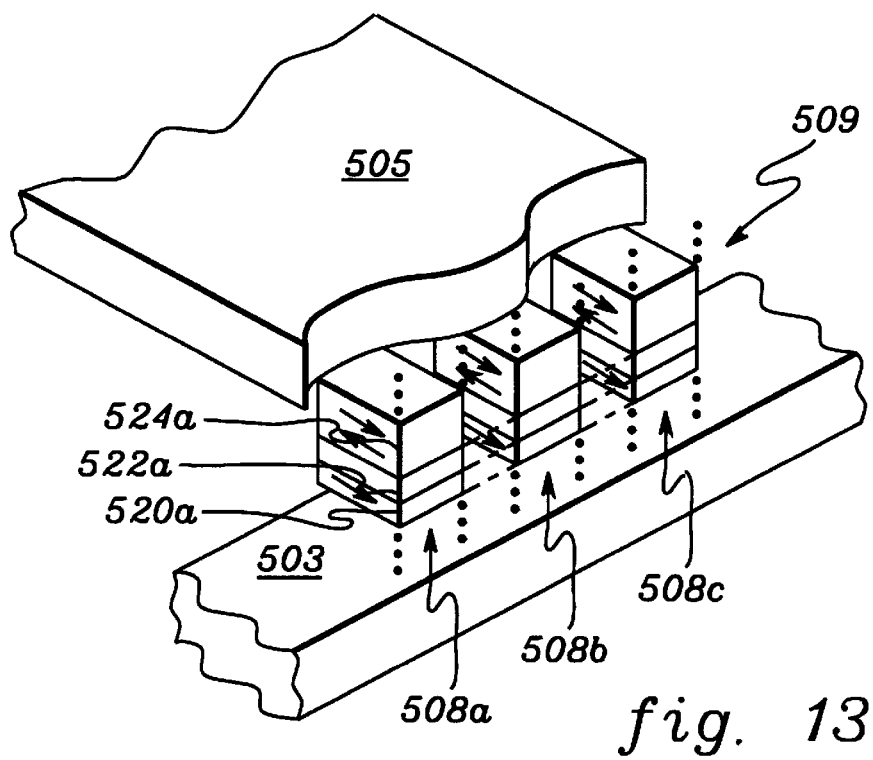
FIG. 13 depicts another embodiment of the present invention in which a magnetic memory cell comprises multiple magnetic tunnel junctions, each having a free region comprising layers with anti-parallel directions of magnetization.

In another alternate embodiment of the present invention, with reference to FIG. 13, a magnetic memory cell 509 comprising separate tunnel junctions 508a, 508b and 508c is provided. In this embodiment, each tunnel junction includes a respective pinned region e.g., 520a, a respective tunneling region, e.g., 522a, and a respective anti-parallel free region, e.g., 524a, comprising two regions having changeable, but opposing directions of magnetization therein. The bottom region of magnetization in region 524a effects tunneling in connection with the pinned layer 520a, through tunneling layer 522a. However, the presence of both opposing directions of magnetization in region 524a (and/or the pinned or reference region 520a) results in a lower net magnetization, and thus magnetic tunnel junction 508a reduces any field coupling to the adjacent tunnel junctions 508b and 508c. Using the anti-parallel, free regions (and/or the pinned or reference region) in each tunnel junction reduces the field coupling between the tunnel junctions, and thus ensures magnetic independence thereof. The anti-parallel regions can be implemented according to the principles of commonly assigned U.S. Pat. No. 5,341,118, incorporated herein by reference in its entirety.

Figure 14:
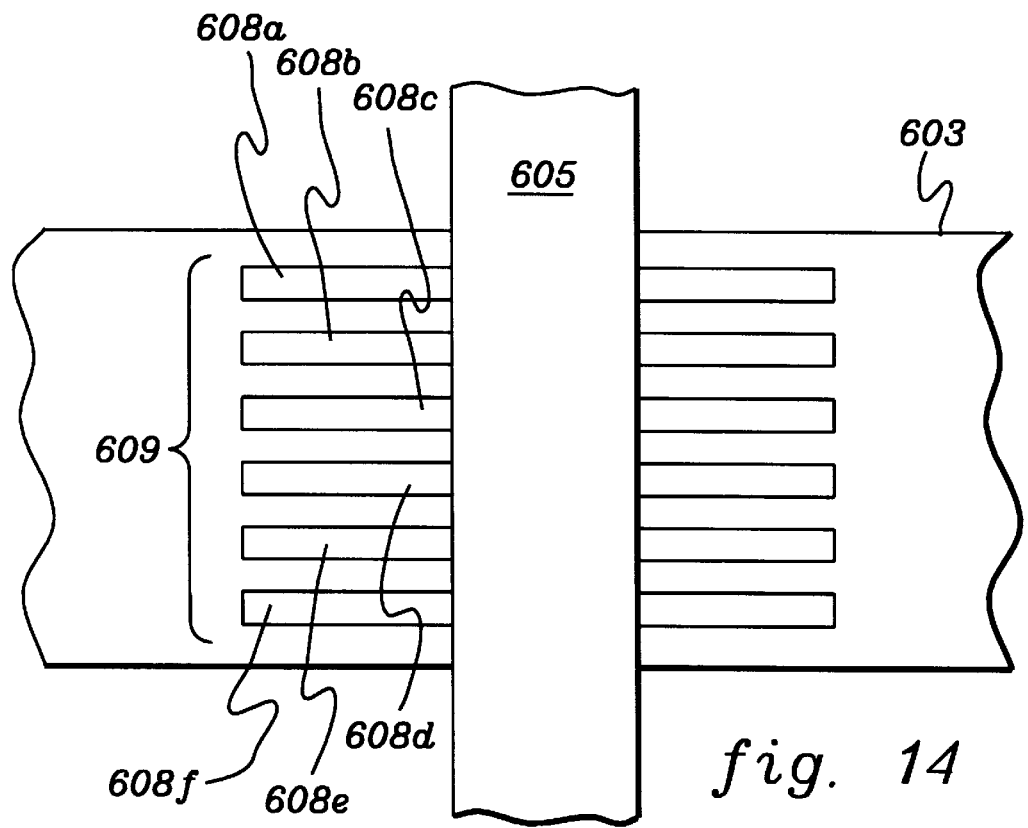
FIG. 14 depicts another embodiment of the present invention in which a magnetic memory cell comprises multiple, elongated magnetic tunnel junctions therein.

In another alternate embodiment of the present invention, with reference to FIG. 14, magnetic memory cell 609 is provided and includes six tunnel junctions 608a–f between word line 603 and bit line 605. In this embodiment, the tunnel junctions are designed to be longer than the width of line 605, so that the more stable magnetic properties toward the middle of the elongated free regions are relied upon for cell operation, rather than the more magnetically unstable end portions thereof. This concept is developed in greater detail in the above-incorporated U.S. Patent Application, "LIMITING MAGNETIC WRITING FIELDS TO A PREFERRED PORTION OF A CHANGEABLE MAGNETIC REGION IN MAGNETIC DEVICES."

The present invention, by providing multiple magnetic tunnel junctions in each magnetic memory cell, increases the predictability of the response of each respective cell, and thus provides cell selectivity on an array-wide basis. As discussed in detail above, the cell selectivity is improved because the average response of each cell can be predicted such that an operating window of applied electrical and therefore magnetic stimuli can be used. A set of applied easy axis and hard axis fields can therefore be identified that switches cells if applied together, but that would not switch cells if either is applied separately, i.e., cells along either the asserted bitline or wordline other than the cell at the intersection of the asserted bitline and wordline.

Another feature/advantage of the present invention is that by providing multiple magnetic tunnel junctions in each cell, there is a built-in tolerance for defective junctions. A defective junction, for example, one with no response to the applied electric/magnetic stimuli, will not affect the overall performance of the array since it is the average response over many junctions that effects the storage of the state in each cell. In contrast, in an embodiment where only one tunnel junction is used for each cell, a defective tunnel junction will completely eliminate the ability to store data in a given cell, and therefore defeat the operation of the entire array.

Figure 15A:
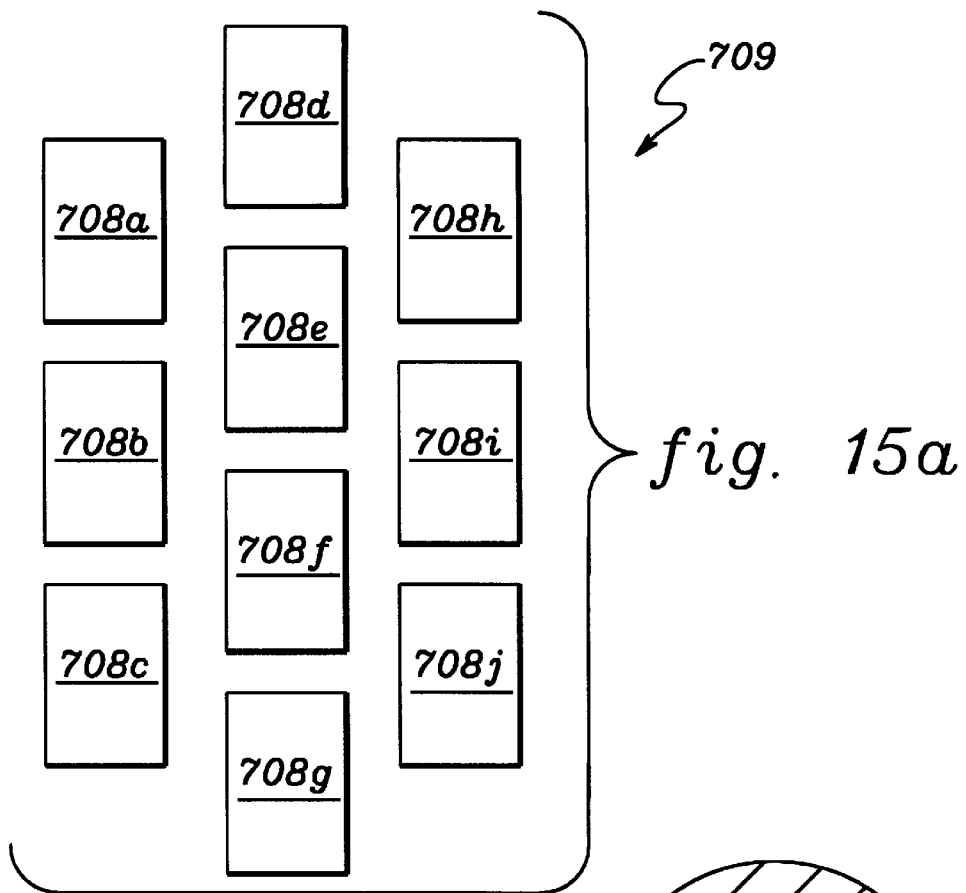
FIGS. 15a–b depict the additional design flexibility, including field shape customization, provided by the present invention.
Figure 15B:
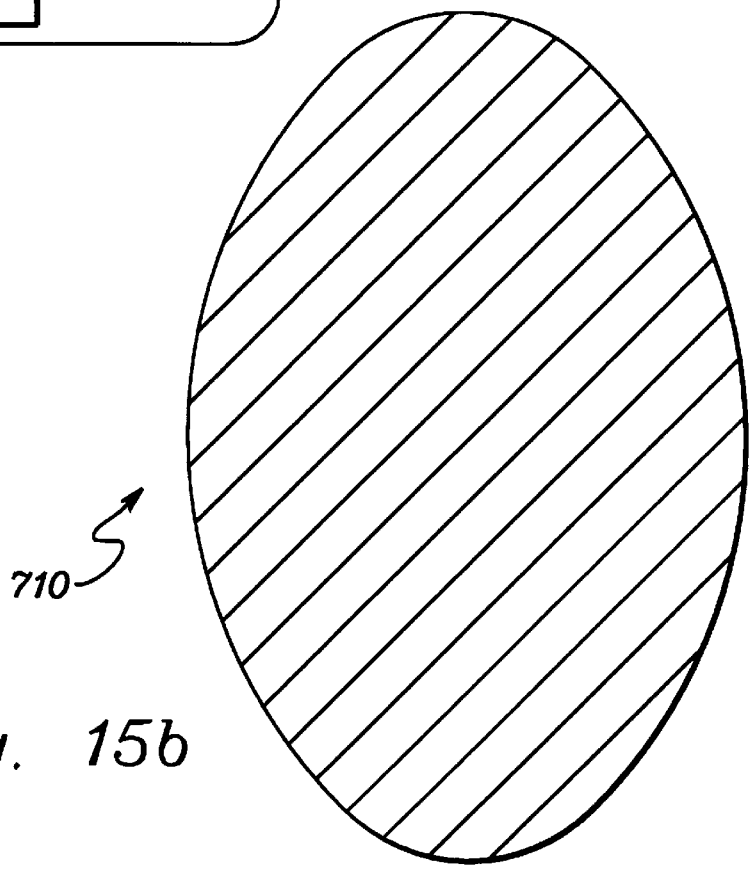

Another feature/advantage of the present invention is that by providing multiple tunnel junctions in each cell, the numbers of junctions, and their layout and spacing, can be advantageously tailored to effect customized magnetic parameters of the array. For example, with reference to FIGS. 15a–b, multiple junction cell 709 may include junctions 708a–j therein arranged with the spacing and layout shown, at a microscopic, micromagnetic level. However, the macroscopic, macromagnetic stimulus field shape 710 results from this spacing and layout, and can therefore be customized as required in accordance with particular system requirements.

Although the invention herein was disclosed in connection with MRAM, the improvements disclosed herein are also applicable to other devices that could be made from such junctions. In particular, these improvements could be applied to magnetic devices in general, including logic devices, sensors and magnetic recording heads.

The principles of the present invention can be used along, or in combination with others disclosed in the above-identified, co-filed U.S. Patent Applications. For example, asymmetric cell arrangement and stimulus approaches can be used such as those disclosed in the above-incorporated U.S. Patent Application entitled "INTENTIONAL ASYMMETRY IMPOSED DURING FABRICATION AND/OR ACCESS OF MAGNETIC TUNNEL JUNCTION DEVICES." Further, by restricting the magneto-resistive electrical interaction to a preferred portion of the changeable magnetic region(s), improved hysteresis loops can be achieved in accordance with the principles of the above-incorporated U.S. Patent Application entitled "LIMITING MAGNETORESISTIVE ELECTRICAL INTERACTION TO A PREFERRED PORTION OF A CHANGEABLE MAGNETIC REGION IN MAGNETIC DEVICES." Also, the magnetic writing fields can be limited to a preferred portion of the changeable magnetic regions of each of the multiple tunnel junctions in accordance with the principles of the above-incorporated U.S. Patent Application entitled "LIMITING MAGNETIC WRITING FIELDS TO A PREFERRED PORTION OF A CHANGEABLE MAGNETIC REGION IN MAGNETIC DEVICES."

While the invention has been particularly shown and described with reference to preferred embodiment(s) thereof, it will be understood by those skilled in the art that various changes in form and details may be made therein without departing from the spirit and scope of the invention.

What is claimed is:

1. A magnetic device, operable using at least one electrode, comprising:
   at least two magnetic tunnel junctions, writable together into an average state to be thereafter sensed as such, according to magnetic stimuli applied thereto via said at least one electrode.

2. The magnetic device of claim 1 in combination with a memory array, said magnetic device comprising a magnetic memory cell of said memory array, said combination including:
   respective pluralities of crossing first and second electrically conductive lines forming a plurality of intersecting regions across the array; and
   a plurality of magnetic memory cells, including said magnetic memory cell, each disposed at a respective one of the plurality of intersecting regions, each of the plurality of magnetic memory cells having at least two magnetic tunnel junctions therein, and therefore a substantially uniform magnetic response, such that only the cell at an intersecting region selected by electrical and resultant magnetic stimuli applied via each of the first and second electrically conductive lines forming said selected intersecting region is written, and cells other than the cell along the first and second electrically conductive lines forming said selected intersecting region are not written.

3. The magnetic device of claim 1, wherein the at least two magnetic tunnel junctions are arranged in series between first and second electrodes of the at least one electrode to accept the magnetic stimuli therefrom.

4. The magnetic device of claim 1, wherein the at least two magnetic tunnel junctions are arranged in parallel between first and second electrodes of the at least one electrode to accept the magnetic stimuli therefrom.

5. The magnetic device of claim 1, wherein each of the at least two magnetic tunnel junctions comprises:
   a first region having a reference direction of magnetization; and
   a second region having a direction of magnetization changeable according to the magnetic stimuli applied thereto.

6. The magnetic device of claim 5, wherein the first region of each of the at least two magnetic tunnel junctions is part of a single, cohesive magnetic region having said reference direction of magnetization.

7. The magnetic device of claim 5, wherein the second regions of the at least two magnetic tunnel junctions are formed to be mutually magnetically decoupled from each other.

8. The magnetic device of claim 7, wherein the second regions of the at least two magnetic tunnel junctions comprise respective layers arranged co-planar to each other and separated by a non-magnetic material.

9. The magnetic device of claim 7, wherein the second region of each of the at least two magnetic tunnel junctions comprises a magnetic granule.

10. The magnetic device of claim 9, wherein the second regions of the at least two magnetic tunnel junctions together comprise a region patterned out of a magnetic media having multiple magnetic granules therein, each magnetic granule forming a respective second region.

11. The magnetic device of claim 1, wherein each of the at least two magnetic tunnel junctions comprises:
   a first region having a reference direction of magnetization; and
   a second region having anti-parallel directions of magnetization therein together changeable according to the electrical and resultant magnetic stimuli applied thereto, one of the anti-parallel directions of magnetization effecting cell tunneling in connection with its respective first region, the anti-parallel directions of magnetization minimizing the mutual magnetic coupling with other magnetic tunnel junctions in said magnetic memory cell.

12. A method for storing an average state in a magnetic device using at least one electrode, comprising:
   writing at least two magnetic tunnel junctions together into said state, according to magnetic stimuli applied thereto via said at least one electrode; and
   thereafter sensing the average state from the at least two magnetic tunnel junctions.

13. The method of claim 12, wherein the at least two magnetic tunnel junctions are arranged in series between first and second electrodes of the at least one electrode to accept the magnetic stimuli therefrom.

14. The method of claim 12, wherein the at least two magnetic tunnel junctions are arranged in parallel between first and second electrodes of the at least one electrode to accept the magnetic stimuli therefrom.

15. The method of claim 12, wherein each of the at least two magnetic tunnel junctions includes:
   a first region having a reference direction of magnetization; and
   a second region having a direction of magnetization changeable according to the magnetic stimuli applied thereto.

16. A method for forming a magnetic device, comprising:
   providing at least one electrode; and
   forming said magnetic device proximate said at least one electrode, the magnetic device including at least two magnetic tunnel junctions therein, writable together into an average state to be thereafter sensed as such, according to magnetic stimuli applied thereto via the at least one electrode.

17. The method of claim 16, wherein the step of forming the magnetic device comprises:
   forming the at least two magnetic tunnel junctions in series between respective first and second electrodes of the at least one electrode to accept the magnetic stimuli therefrom.

18. The method of claim 16, wherein the step of forming the magnetic device comprises:
   forming the at least two magnetic tunnel junctions in parallel between first and second electrodes of the at least one electrode to accept the magnetic stimuli therefrom.

19. The method of claim 16, wherein the step of forming the magnetic device comprises:
   forming a first region in each of the at least two magnetic tunnel junctions, the first regions each having a reference direction of magnetization; and
   forming a second region in each of the at least two magnetic tunnel junctions, the second regions each having a direction of magnetization changeable according to the magnetic stimuli applied thereto.

20. The method of claim 19, wherein the first region of each of the at least two magnetic junctions is formed from a single, cohesive magnetic region having said reference direction of magnetization.

21. The method of claim 19, wherein the second regions of each of the at least two magnetic tunnel junctions are formed to be mutually magnetically decoupled from each other.

22. The method of claim 21, wherein the second regions of the at least two magnetic tunnel junctions are formed as respective layers arranged co-planar to each other and separated by a magnetically insulating material.

23. The method of claim 21, wherein the second region of each of the at least two magnetic tunnel junctions is formed as a magnetic granule.

24. The method of claim 23, wherein the step of forming a second region in each of the at least two magnetic tunnel junctions comprises patterning the second regions together out of a magnetic media having multiple magnetic granules therein, each magnetic granule forming a respective second region.

25. A method for forming a magnetic memory array, comprising:
   providing a plurality of first conductive lines, and a crossing plurality of second conductive lines, thereby forming a plurality of intersecting regions across the array; and
   forming a magnetic memory cell at one intersecting region of the plurality of intersecting regions, the magnetic memory cell including at least two magnetic tunnel junctions therein, writable together into an average state, according to magnetic stimuli applied thereto via the respective first and crossing second lines forming said one intersecting region.

26. The method of claim 25, wherein the step of forming the magnetic memory cell comprises:
   forming the at least two magnetic tunnel junctions in series between the respective first and crossing second lines to accept the magnetic stimuli therefrom.

27. The method of claim 25, wherein the step of forming the magnetic memory cell comprises:
   forming the at least two magnetic tunnel junctions in parallel between the respective first and crossing second lines to accept the magnetic stimuli.

28. The method of claim 25, wherein the step of forming the magnetic memory cell comprises:
   forming a first region in each of the at least two magnetic tunnel junctions, the first regions each having a reference direction of magnetization; and
   forming a second region in each of the at least two magnetic tunnel junctions, the second regions each having a direction of magnetization changeable according to the magnetic stimuli applied thereto.

29. The method of claim 28, wherein the first region of each of the at least two magnetic tunnel junctions is formed from a single, cohesive magnetic region having said reference direction of magnetization.

30. The method of claim 28, wherein the second regions of the at least two magnetic tunnel junctions are formed to be mutually magnetically decoupled from each other.

31. The method of claim 30, wherein the second regions of the at least two magnetic tunnel junctions are formed as respective layers arranged co-planar to each other and separated by a magnetically insulating material.

32. The method of claim 30, wherein the second region of each of the at least two magnetic tunnel junctions is formed as a magnetic granule.

33. The method of claim 32, wherein the step of forming a second region in each of the at least two magnetic tunnel junctions comprises patterning the second regions together out of a magnetic media having multiple magnetic granules therein, each magnetic granule forming a respective second region.

34. The method of claim 25, wherein the step of forming the magnetic memory cell comprises:
   forming a first region in each of the at least two magnetic tunnel junctions, the first regions each having a reference direction of magnetization; and
   forming a second region in each of the at least two magnetic tunnel junctions, the second regions each having anti-parallel directions of magnetization therein together changeable according to the magnetic stimuli applied thereto, one of the anti-parallel directions of magnetization effecting cell tunneling in connection with its respective first region, the anti-parallel directions of magnetization minimizing the mutual magnetic coupling with other magnetic tunnel junctions in said magnetic memory cell.

* * * * *

UNITED STATES PATENT AND TRADEMARK OFFICE
CERTIFICATE OF CORRECTION

PATENT NO.    : 6,072,718
DATED         : June 6, 2000
INVENTOR(S)   : Abraham et al.

It is certified that error appears in the above-identified patent and that said Letters Patent is hereby corrected as shown below:

<u>Title page,</u>
Item [75] Inventors: after "both of N.Y", insert -- Stuart Parkin, San Jose, C.A.; --

<u>Column 11,</u>
Line 58, after "2.", delete "The" and replace with -- A --; and delete "of claim 1"
Line 60, after "said memory array", insert -- operable using at least one electrode and including at least two magnetic tunnel junctions, writable together into an average state according to magnetic stimuli applied thereto via said at least one electrode --.

<u>Column 12,</u>
Line 11, after "3.", delete "The magnetic device of claim 1" and replace with -- A magnetic device, operable using at least one electrode, comprising:
    at least two magnetic tunnel junctions, writable together into an average state according to magnetic stimuli applied thereto via said at least one electrode --
Line 14, after "4.", delete "The magnetic device of claim 1" and replace with -- A magnetic device, operable using at least one electrode, comprising:
    at least two magnetic tunnel junctions, writable together into an average state according to magnetic stimuli applied thereto via said at least one electrode --
Line 38, after "9.", delete "The magnetic device of claim 7" and replace with -- A magnetic device, operable using at least one electorde, comprising:
    at least two magnetic tunnel junctions, writable together into an average state according to magnetic stimuli applied thereto via said at least one electrode, wherein each of the at least two magnetic tunnel junctions comprises:
        a first region having a reference direction of magnetization; and
        a second region having a direction of magnetization changeable according to the magnetic stimuli applied thereto, wherein the second regions of the at least two magnetic tunnel junctions are formed to be mutually magnetically decoupled from each other, and
Line 46, after "11.", delete "The magnetic device of claim 1" and replace with -- A magnetic device, operable using at least one electrode, comprising:
    at least two magnetic tunnel junctions, writable together into an average state according to magnetic stimuli applied thereto via said at least one electrode --
Line 66, after "13.", delete "The method of claim 12" and replace with -- A method for storing an average state in a magnetic device using at least one electrode, comprising:
    using at least two magnetic tunnel junctions, writable together into said state, according to magnetic stimuli applied thereto via said at least one electrode --

UNITED STATES PATENT AND TRADEMARK OFFICE
CERTIFICATE OF CORRECTION

PATENT NO.    : 6,072,718
DATED         : June 6, 2000
INVENTOR(S)   : Abraham et al.

It is certified that error appears in the above-identified patent and that said Letters Patent is hereby corrected as shown below:

<u>Column 13,</u>
Line 3, after "14." delete "The method of claim 12" and replace with -- A method for storing an average state in a magnetic device using at least one electrode, comprising:
 using at least two magnetic tunnel junctions, writable together into said state, according to magnetic stimuli applied thereto via said at least one electrode --
Line 22, after "17.", delete "The method of claim 16" and replace with -- A method for forming a magnetic device, comprising:
 providing at least one electrode; and
 forming said magnetic device proximate said at least one eletrode, the magnetic device including at least two magnetic tunnel junctions therein, writable together into an average state, according to magnetic stimuli applied thereto via the at least one electrode --

Signed and Sealed this

Fourth Day of June, 2002

Attest:

Attesting Officer

JAMES E. ROGAN
*Director of the United States Patent and Trademark Office*